(12) United States Patent
Thomsen et al.

(10) Patent No.: US 8,072,761 B2
(45) Date of Patent: Dec. 6, 2011

(54) POWER SEMICONDUCTOR HEATSINKING

(75) Inventors: Ove Lyck Thomsen, Sjoelund (DK); Claus Andersen, Kolding (DK)

(73) Assignee: American Power Conversion Corporation, West Kingston, RI (US)

( * ) Notice: Subject to any disclaimer, the term of this patent is extended or adjusted under 35 U.S.C. 154(b) by 201 days.

(21) Appl. No.: 12/466,315

(22) Filed: May 14, 2009

(65) Prior Publication Data
US 2010/0290195 A1 Nov. 18, 2010

(51) Int. Cl.
*H05K 7/20* (2006.01)
*F28F 7/00* (2006.01)
*H01L 23/34* (2006.01)

(52) U.S. Cl. ...... 361/719; 165/80.2; 165/80.3; 165/185; 257/719; 361/704; 361/720

(58) Field of Classification Search .............. 257/719
See application file for complete search history.

(56) References Cited

U.S. PATENT DOCUMENTS

| | | | |
|---|---|---|---|
| 4,972,294 A | 11/1990 | Moses, Jr. et al. | |
| 5,930,112 A * | 7/1999 | Babinski et al. | 361/695 |
| 6,079,486 A | 6/2000 | Cennamo et al. | |
| 6,219,246 B1 * | 4/2001 | Edevold et al. | 361/707 |
| 6,252,773 B1 * | 6/2001 | Werner | 361/704 |
| 6,418,024 B2 * | 7/2002 | Edevold et al. | 361/707 |
| 2001/0045779 A1 | 11/2001 | Lee et al. | |
| 2004/0222517 A1 | 11/2004 | Robertson et al. | |
| 2005/0013120 A1 * | 1/2005 | Liu | 361/707 |
| 2005/0099779 A1 | 5/2005 | Vackar | |
| 2005/0270750 A1 * | 12/2005 | Sarno et al. | 361/721 |
| 2009/0257197 A1 | 10/2009 | Yang et al. | |

FOREIGN PATENT DOCUMENTS

| | | |
|---|---|---|
| DE | 19722602 A1 | 12/1998 |
| GB | 2187886 A | 9/1987 |
| GB | 2430310 A | 3/2007 |

OTHER PUBLICATIONS

International Search Report dated Aug. 19, 2010 from International Application No. PCT/US2010/034864, 3 pages.

* cited by examiner

*Primary Examiner* — Gregory Thompson
(74) *Attorney, Agent, or Firm* — Gilman Clark & Hunter, LLC; Shane Hunter

(57) ABSTRACT

A heatsink includes a thermally conductive body including a plurality of fins configured to conduct and dissipate heat. The body is configured to receive a circuit board containing heat-producing electrical components along a width of the body. The heatsink further includes a pivot mechanism pivotally coupled to the body and configured and disposed to contact the heat-producing electrical components. The heatsink further includes a bias device connected to the body and the pivot mechanism and configured to change from a first state to a second state to cause the pivot mechanism to rotate relative to the body to move a contact portion of the pivot mechanism toward the body. The heatsink is configured to receive the heat-producing electrical components between the contact portion of the pivot mechanism and the body, and the bias device is configured to bias the contact portion of the pivot mechanism to urge the heat-producing electrical components against the body when the bias device is in the second state.

22 Claims, 7 Drawing Sheets

POWER SEMICONDUCTOR HEATSINKING

BACKGROUND

Large heatsinks that are attached to multiple heat-producing electrical components can be more efficient at cooling than individual heatsinks attached to individual heat-producing electrical components. A single large heatsink is typically attached to a row of heat-producing electrical components (e.g., semiconductors) by individual springs where each spring is attached to the heatsink with an individual screw. Attaching a large number of screws (e.g., up to about 20 screws per heatsink) is labor intensive, takes a long time and typically involves repeated labor as the screws can come loose or not be adjusted properly, thereby hindering the heat transfer of some of the heat-producing electrical components. Further, high profile components are not able to be located in the vicinity of the heatsink where a screw driver is positioned to tighten the screws to facilitate screw tightening.

SUMMARY

An exemplary heatsink in accordance with the disclosure includes a thermally conductive body including a plurality of fins configured to conduct and dissipate heat, where the body is configured to receive a circuit board containing heat-producing electrical components along a width of the body. The heatsink includes a pivot mechanism pivotally coupled to the body and configured and disposed to contact the heat-producing electrical components, and a bias device connected to the body and the pivot mechanism and configured to change from a first state to a second state to cause the pivot mechanism to rotate relative to the body to move a contact portion of the pivot mechanism toward the body. The heatsink is configured to receive the heat-producing electrical components between the contact portion of the pivot mechanism and the body, and the bias device is configured to bias the contact portion of the pivot mechanism to urge the heat-producing electrical components against the body when the bias device is in the second state.

Embodiments of such a heatsink may include one or more of the following features. The bias device may be connected to a first portion of a pivot arm of the pivot mechanism, the contact portion may be in a second portion of the pivot arm, the pivot arm may be pivotally coupled to the body between the first portion and the second portion, and the bias device may be configured to bias the first portion away from the body when the bias device is in the second state. The bias device may include a first member pivotally coupled to a second member, the first member pivotally coupled to the body at a first pivot point, the second member pivotally coupled to the first portion of the pivot arm at a second pivot point, and a combined length of the first and second members may be greater than a distance between the first and second pivot points when the bias device is in the first state. One of the members may be urged against one of the fins when the bias device is in the second state to lock the bias device in position in the second state. The pivot mechanism may include a plurality of springs connected to a pivot arm, the plurality of springs may be disposed and configured to contact the heat-producing electrical components and to urge the heat-producing electrical components against the body when the bias device is in the second state. The pivot mechanism may have a pivot mechanism width substantially equal to a body width of the body, and the pivot mechanism width and body width may be large enough for the body and the pivot mechanism to contact all of the heat-producing electrical components. The bias device may include a first plate member coupled to the body and a second plate member coupled to the pivot mechanism, where the first plate member may be pivotally coupled to the body, the second plate member may be pivotally coupled to the first portion of the pivot device and the second plate member may be pivotally coupled to the first plate member. The pivot mechanism may be releasably coupled to the body. The bias device may be releasably coupled to the body.

An exemplary uninterruptable power supply in accordance with the disclosure includes a housing, multiple circuit boards disposed in the housing, a power supply disposed in the housing, coupled to the circuit boards and configured to supply power to the circuit boards. The uninterruptable power supply includes heatsinks coupled to the circuit boards and configured to dissipate heat from the circuit boards, the heatsinks being configured to push components of the circuit boards against bodies of the heatsinks. At least one of the heatsinks is configured to be actuated to be thermally coupled to a plurality of the components substantially simultaneously with a single actuation.

Embodiments of such an uninterruptable power supply may include one or more of the following features. The at least one heatsink may include a thermally conductive body including a plurality of fins configured to conduct and dissipate heat, the body being configured to receive the plurality of components along a width of the body, a pivot mechanism pivotally coupled to the body and configured and disposed to contact the plurality of components, and a bias device connected to the body and the pivot mechanism and configured to be actuated from a first state to a second state to cause the pivot mechanism to rotate relative to the body to move a contact portion of the pivot mechanism toward the body. The at least one heatsink may be configured to receive the components between the contact portion of the pivot mechanism and the body, and the bias device may be configured to bias the contact portion of the pivot mechanism to urge the components against the body when the bias device is in the second state. The bias device may be connected to a first portion of a pivot arm of the pivot mechanism, the contact portion may be in a second portion of the pivot arm, the pivot arm may be pivotally coupled to the body between the first portion and the second portion, and the bias device may be configured to bias the first portion away from the body when the bias device is in the second state. The bias device may include a first member pivotally coupled to a second member, the first member may be pivotally coupled to the body at a first pivot point, the second member may be pivotally coupled to the first portion of the pivot arm at a second pivot point, and a combined length of the first and second members may be greater than a distance between the first and second pivot points when the bias device is in the first state. One of the members may be urged against one of the fins when the bias device is in the second state to lock the bias device in position in the second state. The at least one heatsink may be configured to be thermally decoupled from the plurality of components substantially simultaneously with another single actuation.

Another exemplary heatsink in accordance with the disclosure includes means for conducting and dissipating heat from heat-producing electrical components on a circuit board, the conducting and dissipating means being configured to receive the circuit board, means for urging the heat-producing electrical components against the conducting and dissipating means, the conducting and dissipating means and the urging means being configured to receive the heat-producing electrical components between the conducting and dissipating means and the urging means, and means for actuating the urging means from a first state to a second state, the urging means being separated from the heat-producing electrical components in the first state and being urged against the heat-producing electrical components in the second state, the actuating means being configured to actuate the urging means into the second state with a single actuation and de-actuate the urging means from the second state into the first state in a single de-actuation.

Embodiments of such a heatsink may include one or more of the following features. The actuating means may be configured to lock the urging means in the second state. The conducting and dissipating means may include a thermally conductive heatsink body including a plurality of fins. The actuating means may include a first plate member pivotally coupled to the conducting and dissipating means and a second plate member pivotally coupled to the moving means, and the first plate member may be pivotally coupled to the second plate member. The urging means may include a pivot mechanism pivotally coupled to the conducting and dissipating means and configured and disposed to contact the heat-producing electrical components in the second state.

Items and/or techniques discussed herein may provide one or more of the following capabilities. Heatsinks can be attached quickly to multiple heat-producing electrical components. Heatsinks can be detached quickly from multiple components. A second path for conducting and dissipating heat can be provided. Heat transfer capabilities of heatsinks can be increased. Heatsinks can function as an air guide directing air to flow past multiple components. Heatsinks can be coupled simply and quickly and more reliably to multiple components. Clamping heatsinks can be coupled to multiple components simultaneously. While item/technique-effect pairs have been described, it may be possible for a noted effect to be achieved by means other than those noted, and a noted item/technique may not necessarily yield the noted effect.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

The disclosure provided herein describes, among other things, a heatsink for releasably coupling to multiple heat-producing electrical components on a circuit board. Exemplary embodiments of heatsinks are capable of being attached to a row of electrical components and later detached from the electrical components. For example, a heatsink can be detached to replace or repair the electrical components or the entire circuit board. An exemplary heatsink is configured with a thermally conductive body including fins that conduct and dissipate heat. The body is configured to receive the circuit board. A pivot plate is pivotally coupled to the body and a bias device is connected to the body and the pivot plate and configured to change from a first state to a second state to cause the pivot plate to rotate relative to the body to move a contact portion of the pivot plate toward the body. The heatsink is configured to receive the heat-producing electrical components between the contact portion of the pivot plate and the body and the bias device is configured to bias the contact portion of the pivot plate to urge the heat-producing electrical components against the body when the bias device is in the second state.

Figure 1:
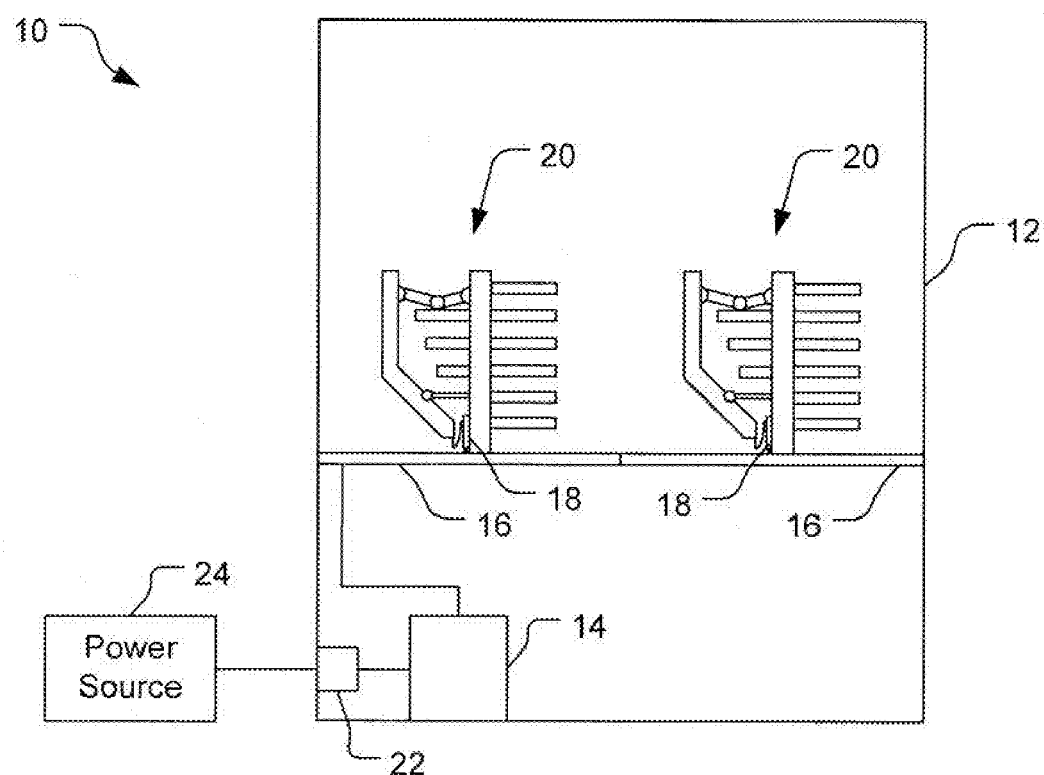
FIG. 1 is a diagram of an electrical system including multiple semiconductor devices coupled to a releasable heatsink.

Referring to FIG. 1, an electrical system 10 includes a housing 12 configured to house circuit boards 16, multiple heat-producing electrical components 18, an electrical interface 14 and heatsinks 20 attached to the components 18. The components 18 are electrically coupled to the circuit boards 16 (e.g., soldered). The heat-producing electrical components 18 can be, e.g., power metal-oxide-semiconductor field-effect-transistors (MOSFETs), high power transistors or insulated gate bipolar transistors (IGBTs), etc. The components 18 switch electrical current from the power source 24 to loads such as computer equipment, telecommunications equipment, data center equipment, computer network equipment, batteries, or other electronic devices. The components 18 are arranged in rows (two in this example). There can be any number of components 18 in a row, for example, 5, 10, 15, 20 or more. The components 18 in a single row are preferably all standard sized power packages having the same dimensions. For example, the components 18 in a single row can all be industry standard power packages such as TO-220, TO-247, TO-264, TO-126, TO-251 or TO-3P power packages. The electrical system 10 is preferably a UPS.

The heatsinks 20 are releasably coupled (e.g., clamped) to each row of components 18 and the circuit boards 16. The heatsink 20 has a width (into the page in FIG. 1) sufficient to contact all of the components 18 in a single row. The heatsink 20 can be removed from the circuit board 16 by being unclamped from the components 18.

The electrical interface 14 is connected to an input 22 which is connected to a power source 24. The electrical interface 14 is electrically coupled to the circuit boards 16. In this example, the housing 12 is configured to receive two circuit boards 16, each releasably coupled with one heatsink 20. The electrical interface 14 includes electrical transform circuitry to transfer the power received from the power source 24 into another form or voltage level. For example, if the power source 24 is an AC power source, then the electrical interface 14 can convert the AC power to DC and from 120 volt or 240 volt to a lower DC voltage. In addition, the electrical interface 14 can provide the power from the power source 24 to charge batteries (not shown) internal or external to the UPS and switch the power on and off using the components 18.

Figure 2:
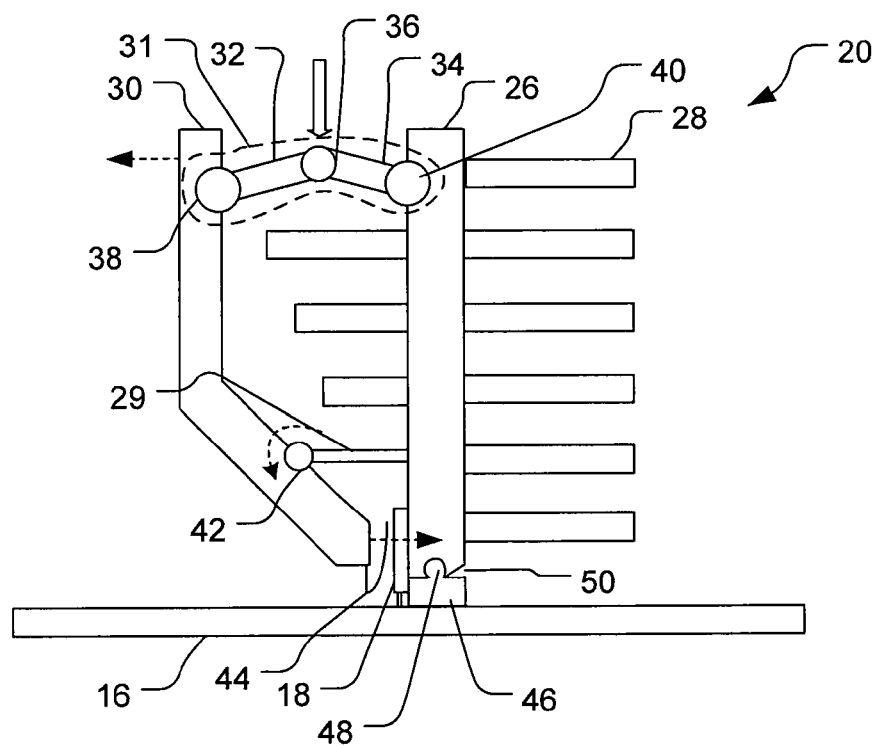
FIG. 2 is a side view of a releasable heatsink in a released state.
Figure 3:
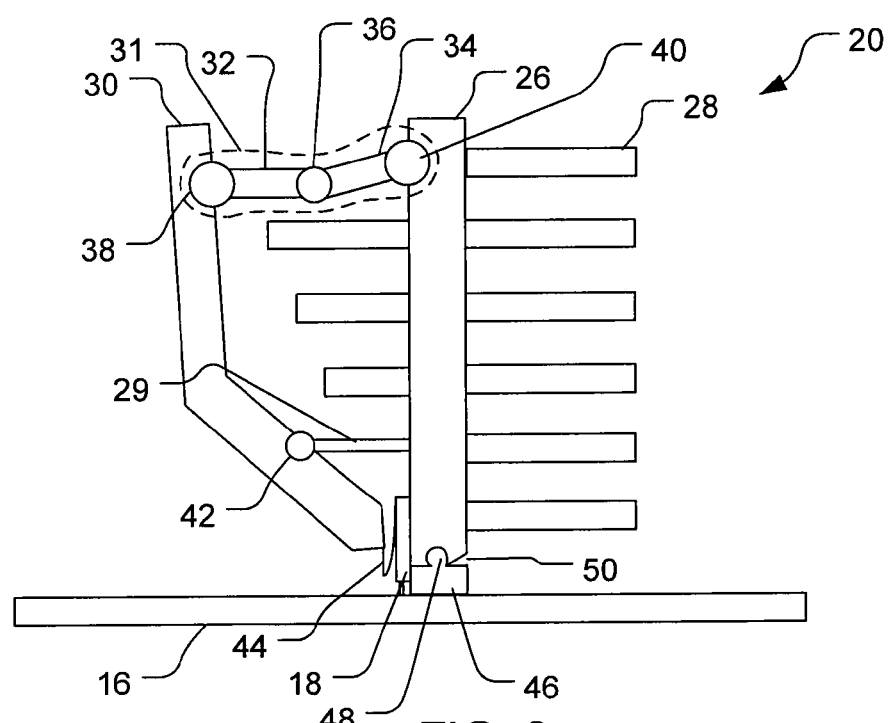
FIG. 3 is a side view of the releasable heatsink of FIG. 2 in a locked state coupled to semiconductor devices.

Referring to FIGS. 2 and 3, the heatsink 20 is shown in an unlocked state and in a locked state, respectively. The heatsink 20 includes a heatsink body 26, multiple fins 28 attached to the heat sink body 26, a pivot mechanism 30, and a bias device 31. The pivot mechanism 30 is pivotally attached to the heatsink body 26 by the bias device 31. The bias device 31 includes a first arm member 32 that is pivotally attached to a second arm member 34 by an intermediate pivot 36. The first arm member 32 is pivotally attached to the pivot mechanism 30 by a pivot 38. The second arm member 34 is pivotally attached to the heatsink body by a pivot 40. The pivot mechanism 30 is also pivotally attached to the body 26 by a fin 29 of the heatsink body 26 at a lower pivot 42. The pivot mechanism 30 could also be attached to the heatsink body 26 by some other means such as one or more posts. The pivots 36, 38, 40 and 42, in this example, include cylindrical rod portions inserted into receptacles, semi-circular in cross-section, formed in the heatsink body 26, the first arm member 32 and the pivot mechanism 30. The rod portions here are integral (monolithic) with the second arm member 34, the first arm member 32 and the fin 29. Other forms of pivots such as hinges can also be used.

The bias device 31 is configured to be actuated from a first state (shown in FIG. 2) to a second state (shown in FIG. 3) to cause the pivot mechanism 30 to rotate relative to the heatsink body 26 to move the upper portion of the pivot mechanism 30 away from the heatsink body 26 and to move the lower contact portion of the pivot mechanism 30 toward the heatsink body 26 as illustrated by the dashed arrows in FIG. 2. The pivot mechanism 30 includes multiple springs 44 disposed and configured to contact the components 18 and to urge the components 18 against the heatsink body 26 when the bias device 31 is in the second state.

The bias device 31 can be actuated from the unlocked first state to the locked second state by a person pushing on the first and second arm members 32 and 34. The force to move the bias device 31 from the first state to the second state depends on the stiffness of the springs 44, the dimensions of the pivot mechanism 30, and the locations of the pivots 38 and 42. Dimensions of the pivot mechanism 30 can determined by experimentation to adjust the force to acceptable levels. The combined length of the first arm member 32 and the second arm member 34 is greater that a distance between the first pivot 38 and the second pivot 40 when the bias device 31 is in the first state when the springs 44 are in contact with the components 18. When the bias device is actuated to be in the second state, the combined length of the first and second arm members serve to urge the springs 44 against the components 18. The force to move the first and second arm members 32 and 34 can be in a range from about 20 N to about 100 N for manual actuation. If a machine is used to actuate the bias device 31, then the actuation force can be higher, up to about 150 N, for example.

The springs 44 are attached to the pivot mechanism 30 by sliding the springs 44 into slots formed in the pivot mechanism. The springs 44 can be self locking in the slots. Alternatively, the springs 44 can be attached to the pivot mechanism 30 by screws. Alternatively, the springs 44 can be attached to a rail that slides into a slot formed in the pivot mechanism 30. The rail can then be attached to the pivot mechanism 30 by screws. The springs 44 are dimensioned to be substantially as wide as the row of components 18. This helps ensure that the components 18 are properly seated against the heatsink body 26. The heatsink body 26 can also include a thermal interface material to improve the heat transfer characteristics between the components 18 and the heatsink body 26. The side of the components 18 that is seated against the heatsink body 26 is, in some cases, a metal plate that is connected to circuitry in the components 18 and/or the circuit board 16. In these cases, the thermal interface material also provides electrical insulation between the components 18 and the heatsink body 26.

The springs 44 are made of a heat treated steel and are pressed against the components 18 at a pressure of about 30 psi resulting in a force of about 15 lb to about 30 lb being applied to each component 18.

The heatsink body 26 is coupled to the circuit board 16 by a track 48 formed on a heatsink interface 46 attached to the circuit board 16. The heatsink interface 46 is formed of an electrical insulating material. The track 48 fits into a cutout formed at the base of the heatsink body 26. The heat sink body 26 provides a cutout portion 50 that allows the heatsink body 26 to be angled away from the components 18 when the heatsink body 26 is slid onto the track 48. By angling the heatsink body 26 away from the components 18, damage to the components 18 and the thermal interface material can be avoided. The springs 44 serve to push the components 18 flush against the heatsink body 26.

The heatsink 20 is about 4 inches high (as measured perpendicular to the circuit board 16), about 4 inches wide (as measured parallel to the circuit board 16 in FIGS. 2 and 3) and about 18 inches long (as measured into the page). The heatsink body 26 and the fins 28 can be a single piece of extruded aluminum. The first and second arm members 32 and 34 and the pivots 38 and 40 can also be extruded aluminum. The pivot mechanism 30 can also be formed of extruded aluminum.

Figure 4:
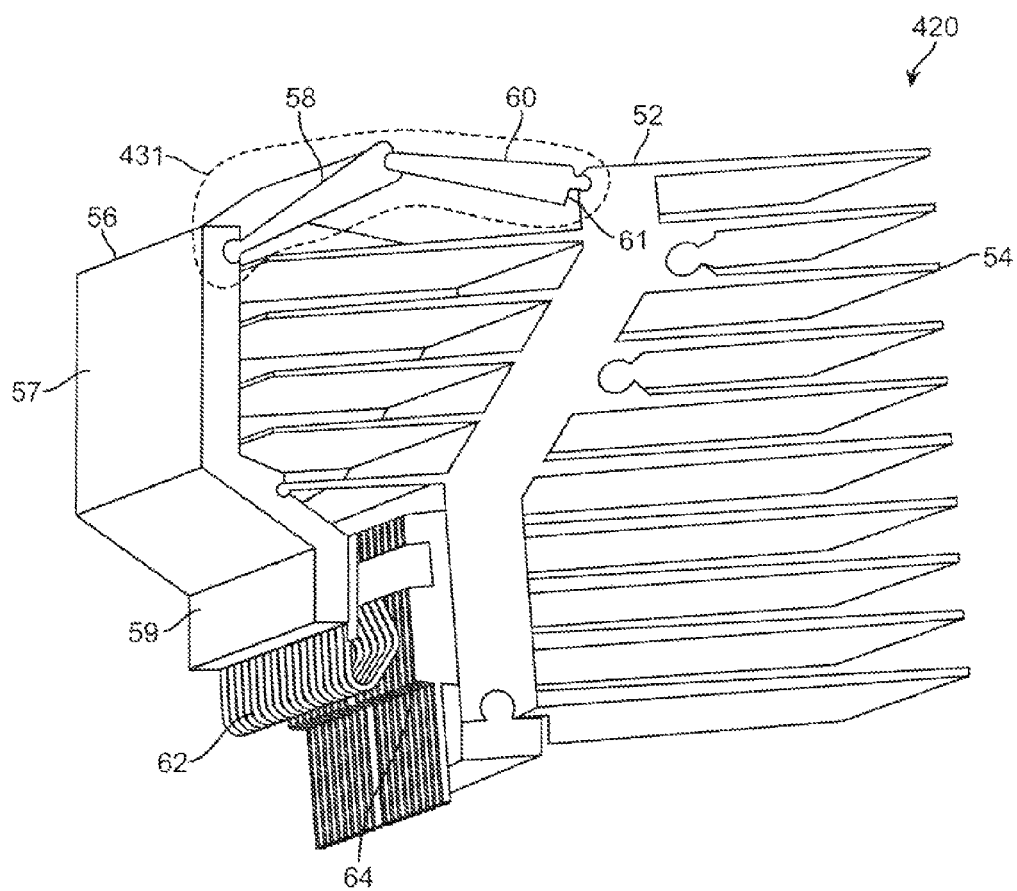
FIG. 4 is an isometric view of a releasable heatsink in the released state.

Referring to FIG. 4, a heatsink 420 is shown in the released state. The heatsink 420 includes a bias device 431 including two plate members 58 and 60, a pivot mechanism 56 and a heatsink body 52 including a plurality of fins 54. The plate members 58 and 60 are separate pieces of extruded aluminum. The plate member 58 is formed to include a cylindrical rod portion that is configured to slide into a semi-circular receptacle formed in the pivot mechanism 56 to pivotally couple the plate member 58 to the pivot mechanism 56. The plate member 58 provides a semi-circular receptacle configured to receive a cylindrical rod portion of the plate member 60 to pivotally couple the plate member 60 to the plate member 58. The plate member 60 is formed with a rounded end portion configured to slide into a semi-circular receptacle formed in the heatsink body 52. The plate member 60 also includes a beveled edge 61 that serves to stop the movement of the plate members 58 and 60 when they are forced to move from the unlocked state shown in FIG. 4 to the locked state. The force of springs 62 serve to urge the beveled edge 61 against the heatsink body 52 to hold the heatsink 420 in the locked state.

The plate members 58 and 60 and the pivot mechanism 56 also function as heat dissipation fins. In addition, the pivot mechanism 56 serves to tunnel air past some of the fins 54 attached to the heatsink body 52.

The pivot mechanism 56 is coupled to the springs 62 that are configured to be pressed against components 64. The widths of the pivot mechanism 56 and the heatsink body 52 are substantially equal to the width of the row of components 64. The widths of an upper portion 57 of the pivot mechanism 56 and the plate members 58 and 60 can be smaller than a width of a lower portion 59 of the pivot mechanism 56 that is attached to the springs 62.

Figure 5:
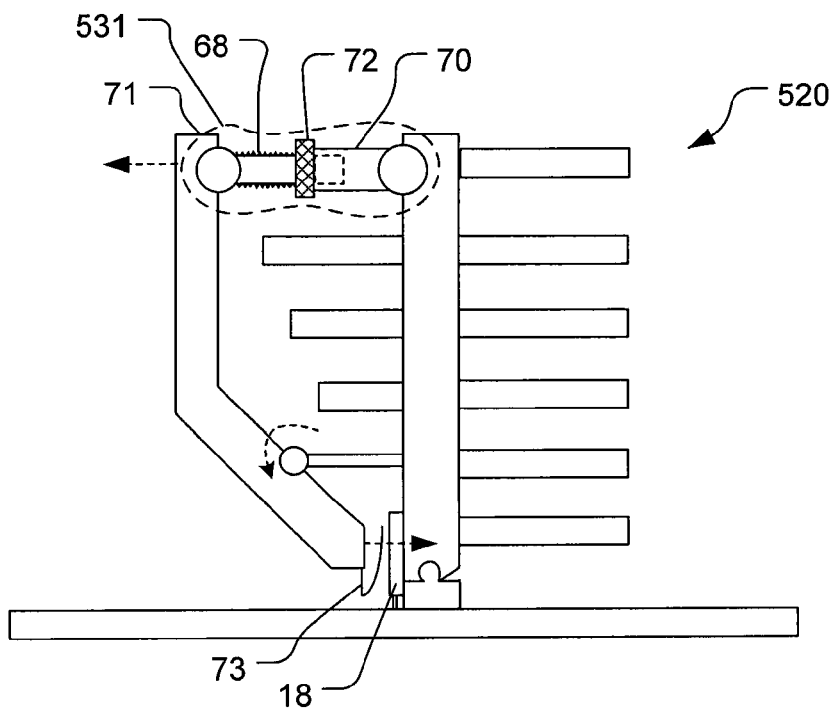
FIG. 5 is a side view of an alternative embodiment of a releasable heatsink in the released state.
Figure 6:
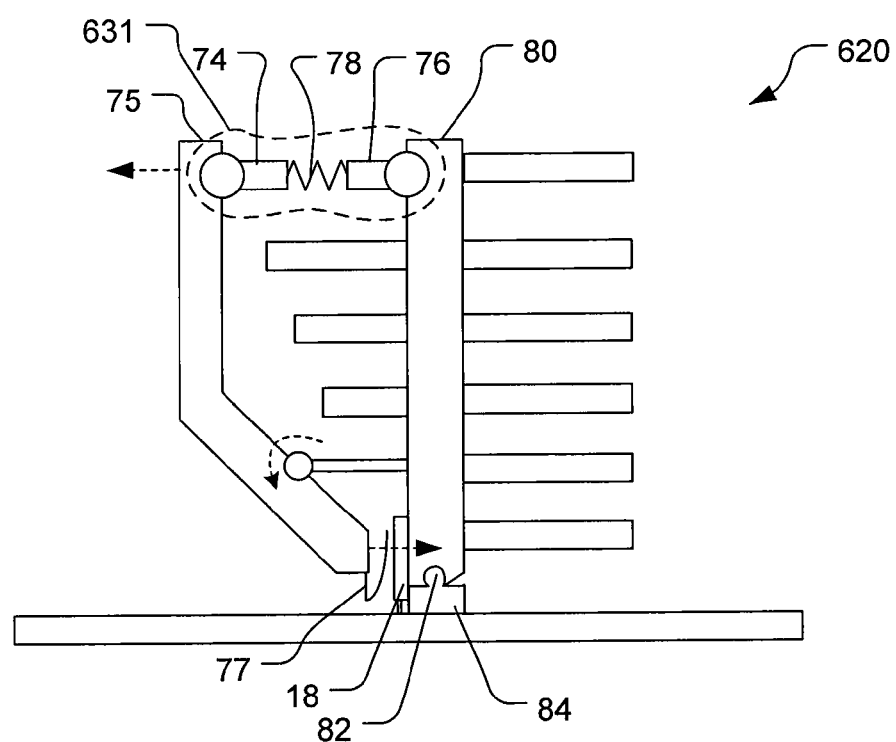
FIG. 6 is a side view of another alternative embodiment of a releasable heatsink in the released state.
Figure 7:
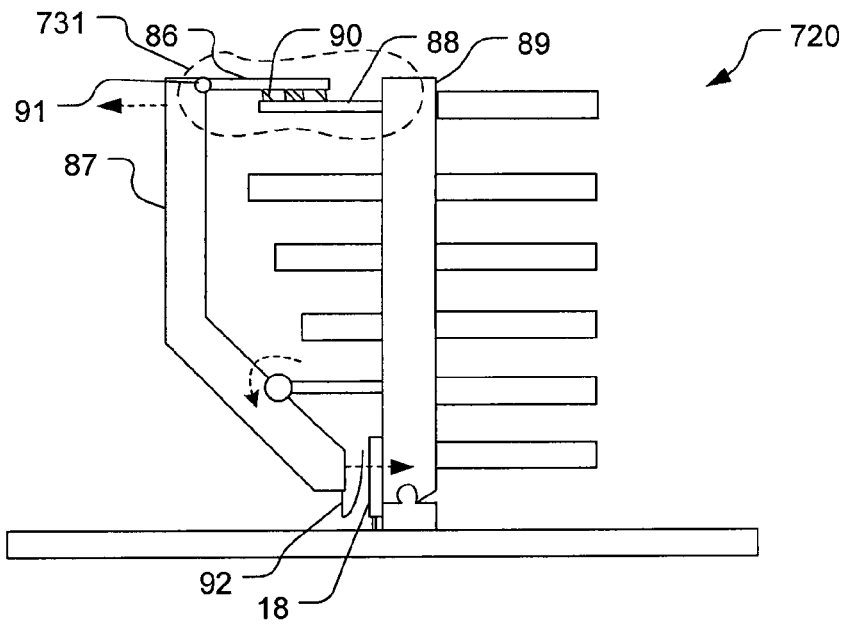
FIG. 7 is a side view of yet another alternative embodiment of a releasable heatsink in the released state.

The heatsinks 20 and 420 shown in FIGS. 1-4 have bias devices that include two arm members (or two plate members) that are pivotally coupled together and configured to be actuated from a first unlocked state into a second locked state in order to press the springs against the components 18. However, other bias devices can be used. FIGS. 5, 6 and 7 illustrate other exemplary bias devices that can be used to attach a heatsink to multiple components 18 simultaneously with a single actuation.

Referring to FIG. 5, a heatsink 520 includes a bias device 531 that includes a screw member 68, a cylinder 70 configured to receive the screw member 68, and a threaded nut 72 coupled to the cylinder 70 and configured to rotate around threads of the screw member 68. When the nut member 72 is rotated in a first direction, the screw member 68 rotates pivot mechanism 71 to rotate the pivot mechanism 71 to push springs 73 against the components 18 in a locked position. When the nut member 72 is rotated in a second direction, the pivot mechanism 71 is allowed to rotate the opposite way due to the spring force of the springs 73 such that the pivot mechanism 71 is moved away from the components 18.

Referring to FIG. 6, a heatsink 620 includes a bias device 631 that includes a first arm member 74, a second arm member 76, and a spring 78 coupled to the first arm member 74 and the second arm member 76. The spring 78 is configured to bias a pivot mechanism 75 to urge springs 77 against the components 18. The heatsink 620 can be attached to the components 18 in a simple manner. First, the pivot mechanism 75 and heatsink body 80 are pushed together to compress the spring 78. Second, the heat sink body 80 is slid onto a track 82 formed on a heatsink interface 84. Third, the pivot mechanism 75 and the heatsink body are released to allow the pivot mechanism 75 to be rotated by the spring 78 to urge the springs 77 against the components 18.

Referring to FIG. 7, a heatsink 720 includes a bias device 731 that includes a first arm member 86 coupled to a pivot mechanism 87, and a second arm member 88 coupled to a heatsink body 89. The first and second arm members 86 and 88 include multiple teeth 90. A spring loaded pivot 91 is configured to urge the arm member 86 against the arm member 88. When the pivot mechanism 87 is pulled away from the heatsink body 89 into an actuate position, the spring loaded pivot 91 allows the arm member 86 to rotate such that the teeth 90 slide over each other. When the teeth 90 have slid past each other, the spring loaded pivot 91 urges the arm member 86 against the arm member 88. At the same time, the springs 92 are urged against the components 18, which in turn urge the teeth 90 against each other and lock into place to hold the pivot mechanism 87 in a locked state. The pivot mechanism 87 can be released from the locked state by pulling up on the arm member 86 such that the teeth 90 can pass each other at the urging of the springs 92.

Figure 8:
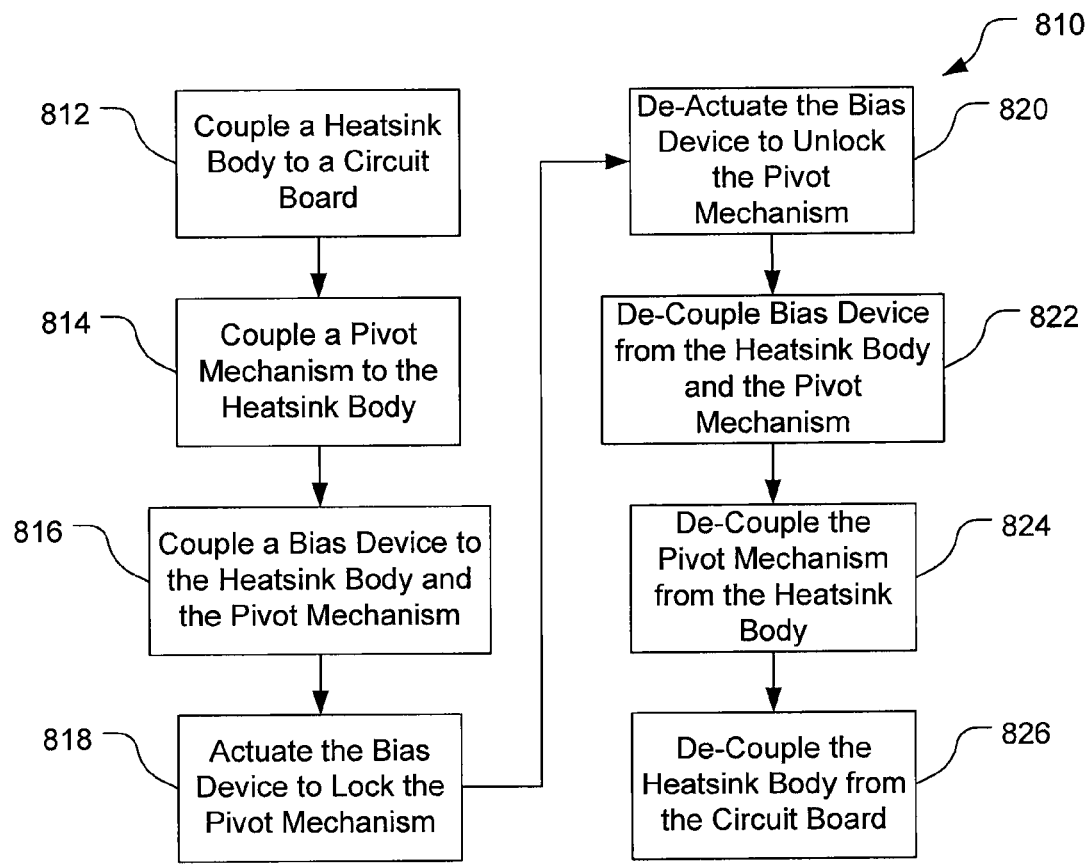
FIG. 8 is a block flow diagram of a process of coupling the heatsinks of FIGS. 2-7 to heat-producing electrical components of a circuit board.

Referring to FIG. 8, a process 810 for coupling and decoupling the heatsinks of FIGS. 2-7 to components 18 of a circuit board includes the stages shown. The process 810 is exemplary only and not limiting. The process 810 may be altered, e.g., by having stages added, removed, or rearranged. The process 810 can be performed manually. Alternatively, machinery may be used to perform some or all of the process 810.

The process 810 will be described in reference to the heatsink 20 illustrated in FIGS. 1-3. However, the process 810 can be used to couple any of the heatsinks illustrated in FIGS. 1-7, and 9-10 (discussed below) to components 18. At stage 812, the heat sink body 26 is coupled to the circuit board 16 via the track 48 of the heatsink interface 46. The heatsink body 26 is tilted away from the components 18 as provided by the cutout portion 50 and the body 26 is slid onto the track 48. At stage 814, the pivot mechanism 30 is coupled to the heatsink body via the pivot 42. The cylindrical rod portion of the pivot 42 formed on the fin 29 is slid into a semicircular receptacle formed in the pivot mechanism 30.

At stage 816, the bias device 31, including the first arm member 32 and the second arm member 34, is coupled to the heatsink body 26 and the pivot mechanism 30. The arm members 32 and 34 are positioned as shown in FIG. 2 while the bias device is being attached to the heatsink body 26 and the pivot mechanism 30 at the stage 816. In this example, the first arm member 32 is coupled to the pivot mechanism 30 by sliding the pivot 38 into a receptacle formed in the pivot mechanism 30 and the second arm member 34 is coupled to the heatsink body 26 by sliding the pivot 40 into a receptacle formed in the heatsink body 26.

At stage 818, the bias device 31 is actuated from the unlocked first state as shown in FIG. 2 to the locked second state as shown in FIG. 3. The bias device 31 can be pushed manually to move from the unlocked position to the locked position. Alternatively, machinery may be used to move the bias device from the unlocked position to the locked position.

Upon completion of stage 818, the heatsink 20 is coupled to the components 18. The heatsink 20 can be decoupled by performing stages 820 through 826. At stage 820, the bias device 31 is de-actuated to move from the locked position into the unlocked position. The de-actuation can performed by pulling on the bias device 31 in the opposite direction of the actuation performed at stage 818.

At stage 822, the bias device 31, including the first arm member 32 and the second arm member 34, is de-coupled from the heatsink body 26 and the pivot mechanism 30. At stage 824, the pivot mechanism 30 is decoupled from the heatsink body 26. At stage 826, the heatsink body 26 is de-coupled from the circuit board 16.

Figure 9:
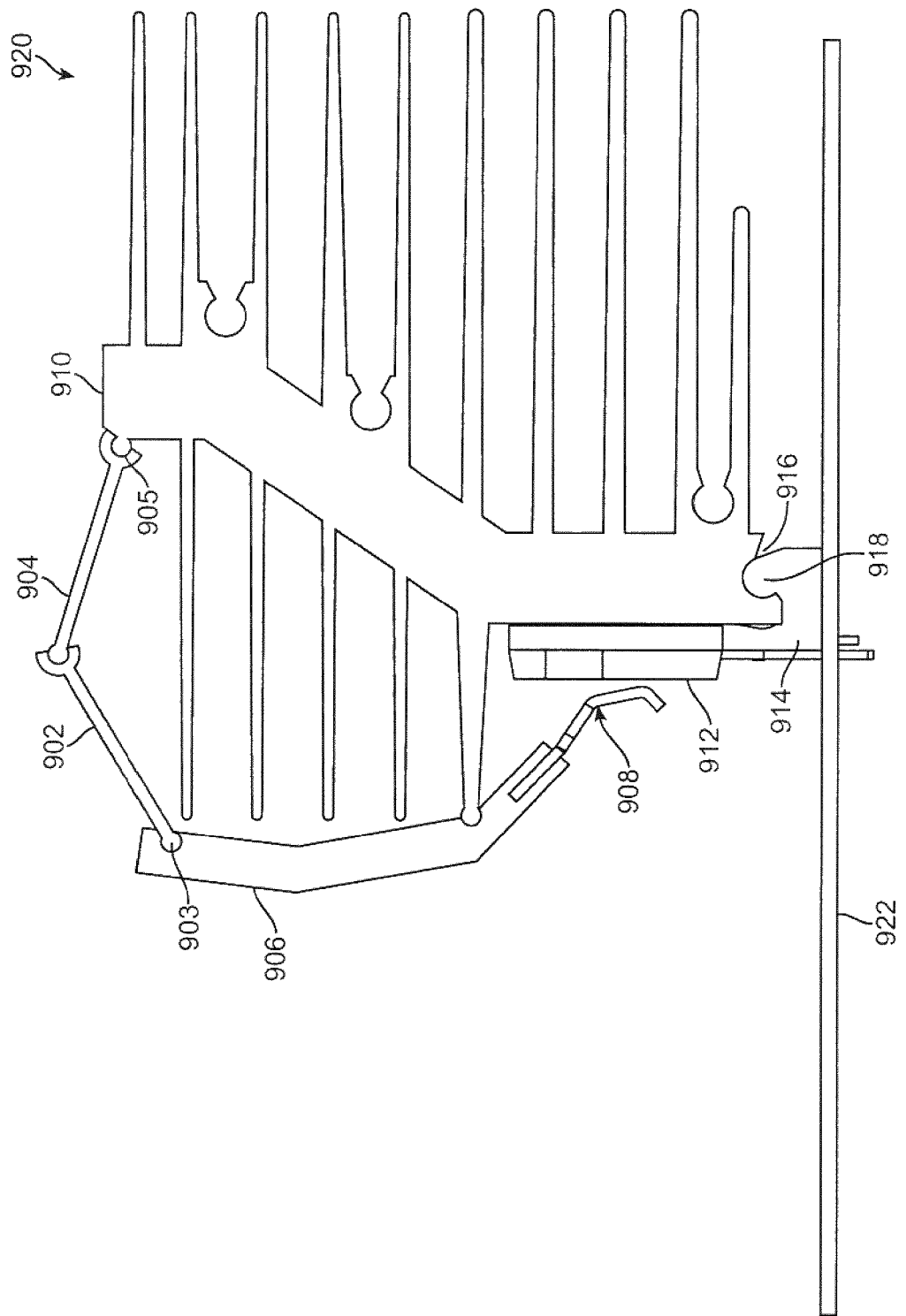
FIGS. 9 and 10 are side views of yet another embodiment of a releasable heatsink in a released state and in a locked state, respectively.
Figure 10:
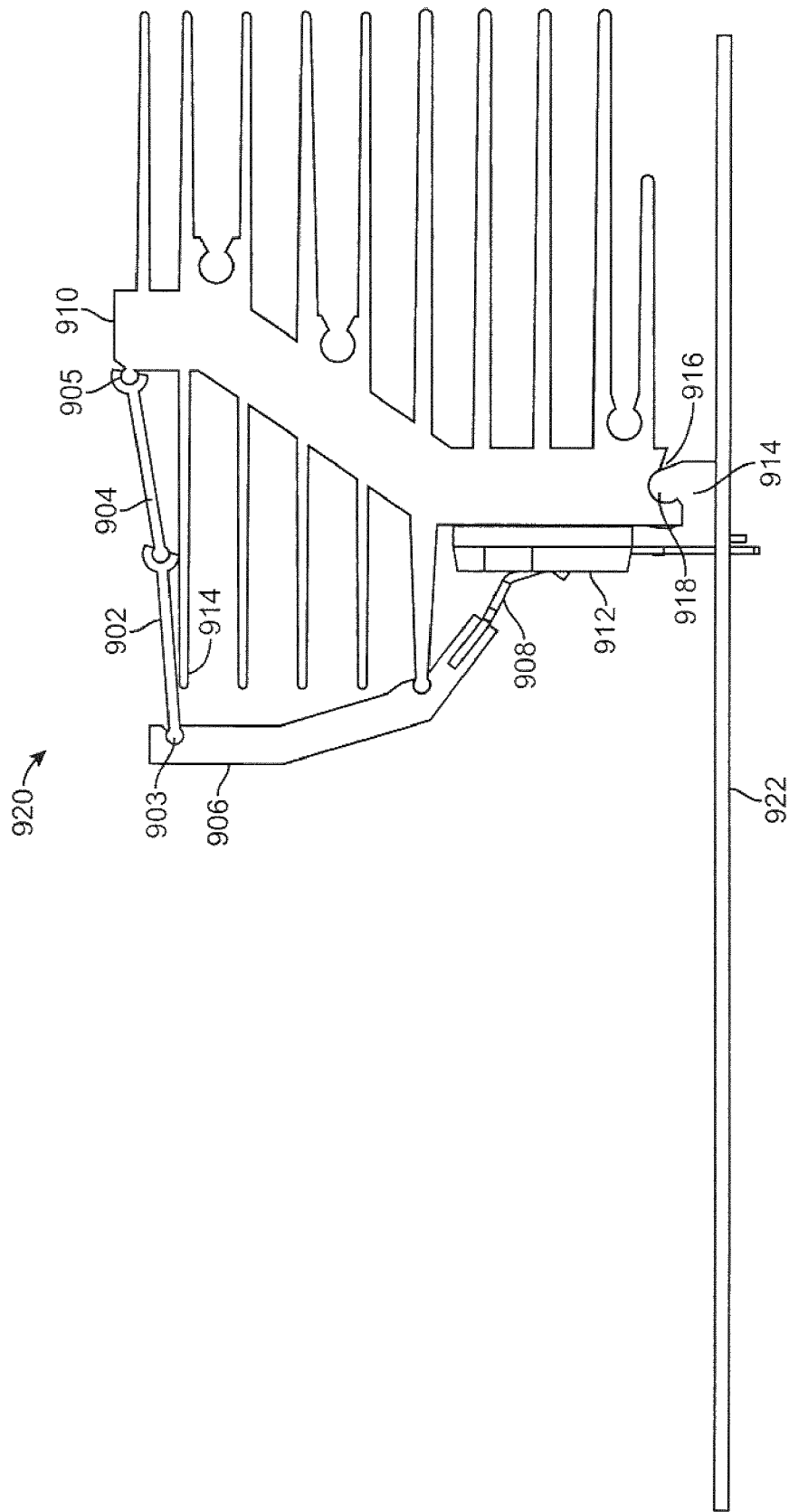

Referring to FIGS. 9 and 10, a heatsink 920 is shown. The heatsink 920 is shown in an unlocked first state in FIG. 9 with a first arm member 902 and a second arm member 904 in a released position. The first and second arm members 902 and 904 are similar to the first and second arm members 32 and 34 in FIGS. 2 and 3. In the released position, as shown in FIG. 9, a pivot mechanism 906 and springs 908 are rotated relative to a heatsink body 910 such that the springs 908 are spaced apart from a heat-producing semiconductor 912.

The first arm member 902 is pivotally coupled to the pivot mechanism 906 by a first pivot 903. The second arm member 904 is pivotally coupled to the heatsink body 910 with a second pivot 905. The combined length of the first arm member 902 and the second arm member 904 is greater that a distance between the first pivot 903 and the second pivot 905 when the heatsink 920 is in the released state when the springs 908 are just contacting the components 912.

In FIG. 10, the heatsink 920 is in a second locked or clamped state with the first and second arm members 902 and 904 pushed down and held against a fin 914. The springs 908 are pressed against the heat-producing semiconductor 912 to urge the heat-producing component 912 against the heatsink body 910. The springs 908 also serve to hold the first and second arm members 902 and 904 against the fin 914 to keep the heatsink 920 in the locked second state.

The heatsink 920 is mounted to a heatsink interface 914 attached to a circuit board 922. A cutout 916, formed in the heatsink body 910, and the heatsink interface 914 are configured such that the heatsink body can be rotated clockwise and snapped onto a track 918 on the heatsink interface 914. After snapping into place, the heatsink body 910 is rotated counterclockwise to vertical to contact the semiconductor 912.

The bias devices described above all used manual actuations of one form or another. In addition to manually actuated bias devices, other forms of bias devices such as electromechanical devices, hydraulic devices or pneumatic devices, etc., could also be used.

More than one invention may be described herein.

What is claimed is:

1. A heatsink comprising:
   a thermally conductive body including a plurality of fins configured to conduct and dissipate heat, the body being configured to receive a circuit board containing a plurality of heat-producing electrical components along a width of the body;
   a pivot mechanism pivotally coupled to the body and configured and disposed to contact the plurality of heat-producing electrical components; and
   a bias device connected to the body and the pivot mechanism and configured to change from a first state to a second state to cause the pivot mechanism to rotate relative to the body to move a contact portion of the pivot mechanism toward the body;
   the heatsink being configured to receive the heat-producing electrical components between the contact portion of the pivot mechanism and the body;
   the bias device being configured to bias the contact portion of the pivot mechanism to urge the heat-producing electrical components against the body when the bias device is in the second state; and
   wherein the bias device comprises a first member pivotally coupled to a second member, the first member pivotally coupled to the body at a first pivot point, the second member pivotally coupled to the pivot arm at a second pivot point, and a combined length of the first and second members is greater than a distance between the first and second pivot points when the bias device is in the first state.

2. The heatsink of claim 1 wherein the bias device is connected to a first portion of a pivot arm of the pivot mechanism, the contact portion is in a second portion of the pivot arm, the pivot arm is pivotally coupled to the body between the first portion and the second portion, and the bias device is configured to bias the first portion away from the body when the bias device is in the second state.

3. The heatsink of claim 1 wherein the bias device is urged against one of the fins when the bias device is in the second state to lock the bias device in position in the second state.

4. The heatsink of claim 1 wherein the pivot mechanism comprises a plurality of springs connected to a pivot arm, the plurality of springs being disposed and configured to contact the heat-producing electrical components and to urge the heat-producing electrical components against the body when the bias device is in the second state.

5. The heatsink of claim 1 wherein the pivot mechanism has a pivot mechanism width substantially equal to a body width of the body, the pivot mechanism width and body width being large enough for the body and the pivot mechanism to contact all of the heat-producing electrical components.

6. The heatsink of claim 1 wherein the pivot mechanism is releasably coupled to the body.

7. The heatsink of claim 1 wherein the bias device is releasably coupled to the body.

8. The heatsink of claim 1 wherein proximal ends of the fins are connected to a central portion of the body along a vertical length of the central portion, the fins extend laterally away from the central portion of the body to distal ends, and a portion of the pivot mechanism extends adjacent to the distal ends of at least two of the fins to provide a tunnel between the at least two fins, the central portion of the body, and the portion of the pivot mechanism.

9. A heatsink comprising:
   a thermally conductive body including a plurality of fins configured to conduct and dissipate heat, the body being configured to receive a circuit board containing a plurality of heat-producing electrical components along a width of the body;
   a pivot mechanism pivotally coupled to the body and configured and disposed to contact the plurality of heat-producing electrical components; and
   a bias device connected to the body and the pivot mechanism and configured to change from a first state to a second state to cause the pivot mechanism to rotate relative to the body to move a contact portion of the pivot mechanism toward the body;
   the heatsink being configured to receive the heat-producing electrical components between the contact portion of the pivot mechanism and the body;
   the bias device being configured to bias the contact portion of the pivot mechanism to urge the heat-producing electrical components against the body when the bias device is in the second state; and
   wherein the bias device comprises a first plate member coupled to the body and a second plate member coupled to the pivot mechanism, wherein the first plate member is pivotally coupled to the body, the second plate member is pivotally coupled to the pivot mechanism and the second plate member is pivotally coupled to the first plate member.

10. An uninterruptable power supply comprising:
    a housing;
    multiple circuit boards disposed in the housing;
    a power supply disposed in the housing, coupled to the circuit boards and configured to supply power to the circuit boards; and
    heatsinks coupled to the circuit boards and configured to dissipate heat from the circuit boards, the heatsinks being configured to push components of the circuit boards against bodies of the heatsinks,
    wherein at least one of the heatsinks is configured to be actuated to be thermally coupled to a plurality of the components substantially simultaneously with a single actuation,
    wherein the at least one heatsink comprises:
      a thermally conductive body including a plurality of fins configured to conduct and dissipate heat, the body being configured to receive the plurality of components along a width of the body;
      a pivot mechanism pivotally coupled to the body and configured and disposed to contact the plurality of components; and
      a bias device connected to the body and the pivot mechanism and configured to be actuated from a first state to a second state to cause the pivot mechanism to rotate relative to the body to move a contact portion of the pivot mechanism toward the body;
      the at least one heatsink being configured to receive the components between the contact portion of the pivot mechanism and the body;
      the bias device being configured to bias the contact portion of the pivot mechanism to urge the components against the body when the bias device is in the second state; and
      the bias device comprising a first member pivotally coupled to a second member, the first member pivotally coupled to the body at a first pivot point, the second member pivotally coupled to the pivot arm at a second pivot point, and a combined length of the first and second members is greater than a distance between the first and second pivot points when the bias device is in the first state.

11. The uninterruptable power supply of claim 10 wherein the bias device is connected to a first portion of a pivot arm of the pivot mechanism, the contact portion is in a second portion of the pivot arm, the pivot arm is pivotally coupled to the body between the first portion and the second portion, and the bias device is configured to bias the first portion away from the body when the bias device is in the second state.

12. The uninterruptable power supply of claim 10 wherein one of the members is urged against one of the fins when the bias device is in the second state to lock the bias device in position in the second state.

13. The uninterruptable power supply of claim 10, wherein the at least one heatsink is configured to be thermally decoupled from the plurality of components substantially simultaneously with another single actuation.

14. The uninterruptible power supply of claim 10 wherein proximal ends of the fins are connected to a central portion of the body along a vertical length of the central portion, the fins extend laterally away from the central portion of the body to distal ends, and a portion of the pivot mechanism extends adjacent to the distal ends of at least two of the fins to provide a tunnel between the at least two fins, the central portion of the body, and the portion of the pivot mechanism.

15. A heatsink comprising:
 means for conducting and dissipating heat from a plurality of heat-producing electrical components on a circuit board, the conducting and dissipating means being configured to receive the circuit board;
 means for urging the heat-producing electrical components against the conducting and dissipating means, the conducting and dissipating means and the urging means being configured to receive the heat-producing electrical components between the conducting and dissipating means and the urging means; and
 means for actuating the urging means from a first state to a second state, the urging means being separated from the heat-producing electrical components in the first state and being urged against the heat-producing electrical components in the second state, the actuating means being configured to actuate the urging means into the second state with a single actuation and de-actuate the urging means from the second state into the first state in a single de-actuation;
 wherein the actuating means comprises a first plate member pivotally coupled to the conducting and dissipating means and a second plate member pivotally coupled to the urging means, the first plate member being pivotally coupled to the second plate member.

16. The heatsink of claim 15 wherein the actuating means is configured to lock the urging means in the second state.

17. The heatsink of claim 15 wherein the conducting and dissipating means comprises a thermally conductive heatsink body including a plurality of fins.

18. The heatsink of claim 15 wherein the urging means comprises a pivot mechanism pivotally coupled to the conducting and dissipating means and configured and disposed to contact the plurality of heat-producing electrical components in the second state.

19. A heatsink comprising:
 a thermally conductive body including a plurality of fins configured to conduct and dissipate heat, the body being configured to receive a circuit board containing a plurality of heat-producing electrical components along a width of the body;
 a pivot mechanism pivotally coupled to the body and configured and disposed to contact the plurality of heat-producing electrical components; and
 a bias device connected to the body and the pivot mechanism and configured to change from a first state to a second state to cause the pivot mechanism to rotate relative to the body to move a contact portion of the pivot mechanism toward the body;
 the heatsink being configured to receive the heat-producing electrical components between the contact portion of the pivot mechanism and the body;
 the bias device being configured to bias the contact portion of the pivot mechanism to urge the heat-producing electrical components against the body when the bias device is in the second state; and
 wherein proximal ends of the fins are connected to a central portion of the body along a vertical length of the central portion, the fins extend laterally away from the central portion of the body to distal ends, and a first, upper portion of the pivot mechanism extends adjacent to the distal ends of at least two of the fins to provide a tunnel between the at least two fins, the central portion of the body, and the first portion of the pivot mechanism.

20. The heatsink of claim 19 wherein the bias device is connected to the first portion of the pivot mechanism, the contact portion is in a second, lower portion of the pivot mechanism, the pivot mechanism is pivotally coupled to the body between the first portion and the second portion, and the bias device is configured to bias the first portion away from the body when the bias device is in the second state.

21. An uninterruptable power supply comprising:
 a housing;
 multiple circuit boards disposed in the housing;
 a power supply disposed in the housing, coupled to the circuit boards and configured to supply power to the circuit boards; and
 heatsinks coupled to the circuit boards and configured to dissipate heat from the circuit boards, the heatsinks being configured to push components of the circuit boards against bodies of the heatsinks,
 wherein at least one of the heatsinks is configured to be actuated to be thermally coupled to a plurality of the components substantially simultaneously with a single actuation,
 wherein the at least one heatsink comprises:
  a thermally conductive body including a plurality of fins configured to conduct and dissipate heat, the body being configured to receive the plurality of components along a width of the body;
  a pivot mechanism pivotally coupled to the body and configured and disposed to contact the plurality of components; and
  a bias device connected to the body and the pivot mechanism and configured to be actuated from a first state to a second state to cause the pivot mechanism to rotate relative to the body to move a contact portion of the pivot mechanism toward the body;
  the at least one heatsink being configured to receive the components between the contact portion of the pivot mechanism and the body;
  the bias device being configured to bias the contact portion of the pivot mechanism to urge the components against the body when the bias device is in the second state; and
 wherein proximal ends of the fins are connected to a central portion of the body along a vertical length of the central portion, the fins extend laterally away from the central portion of the body to distal ends, and a first, upper portion of the pivot mechanism extends adjacent to the distal ends of at least two of the fins to provide a tunnel between the at least two fins, the central portion of the body, and the first portion of the pivot mechanism.

22. The uninterruptible power supply of claim 21 wherein the bias device is connected to the first portion of the pivot mechanism, the contact portion is in a second, lower portion of the pivot mechanism, the pivot mechanism is pivotally coupled to the body between the first portion and the second portion, and the bias device is configured to bias the first portion away from the body when the bias device is in the second state.

* * * * *